(12) United States Patent
Bouras

(10) Patent No.: US 10,969,177 B2
(45) Date of Patent: Apr. 6, 2021

(54) PIN FIN HEAT SINK WITH INTEGRATED PHASE CHANGE MATERIAL AND METHOD

(71) Applicant: HAMILTON SUNDSTRAND CORPORATION, Charlotte, NC (US)

(72) Inventor: Scott R. Bouras, Rockford, IL (US)

(73) Assignee: HAMILTON SUNSTRAND CORPORATION, Charlotte, NC (US)

( * ) Notice: Subject to any disclaimer, the term of this patent is extended or adjusted under 35 U.S.C. 154(b) by 202 days.

(21) Appl. No.: 16/358,262

(22) Filed: Mar. 19, 2019

(65) Prior Publication Data

US 2019/0212073 A1  Jul. 11, 2019

Related U.S. Application Data

(63) Continuation-in-part of application No. 15/280,074, filed on Sep. 29, 2016, now Pat. No. 10,375,857.

(51) Int. Cl.
| | |
|---|---|
| *F28D 20/02* | (2006.01) |
| *F28F 3/02* | (2006.01) |
| *H01L 23/373* | (2006.01) |
| *H01L 23/427* | (2006.01) |

(52) U.S. Cl.
CPC .......... *F28D 20/023* (2013.01); *F28F 3/022* (2013.01); *H01L 23/3733* (2013.01); *H01L 23/3736* (2013.01); *H01L 23/427* (2013.01); *F28F 3/02* (2013.01); *F28F 2215/04* (2013.01); *F28F 2215/06* (2013.01)

(58) Field of Classification Search
CPC . F28D 20/023; F28F 3/02; F28F 3/022; F28F 2215/04; F28F 2215/06; H01L 23/3733; H01L 23/3736; H01L 23/427

USPC .............. 165/104.33, 104.17, 104.26
See application file for complete search history.

(56) References Cited

U.S. PATENT DOCUMENTS

| | | | |
|---|---|---|---|
| 6,820,684 B1 | 11/2004 | Chu et al. | |
| 7,191,820 B2 | 3/2007 | Chou et al. | |
| 7,718,246 B2 | 5/2010 | Strauss | |
| 2004/0170806 A1 | 9/2004 | Hittle et al. | |
| 2005/0135061 A1* | 6/2005 | Kiley .................. | F28D 15/0266 361/700 |
| 2009/0223160 A1 | 9/2009 | Hittle et al. | |

(Continued)

FOREIGN PATENT DOCUMENTS

| | | |
|---|---|---|
| CN | 103234377 A | 8/2013 |
| EP | 3301392 A1 | 4/2018 |
| WO | 2016062577 A1 | 4/2016 |

OTHER PUBLICATIONS

Search Report regarding related EP Application No. 17192990.4; dated Mar. 1, 2018; 6 pgs.

(Continued)

*Primary Examiner* — Joel M Attey
(74) *Attorney, Agent, or Firm* — Cantor Colburn LLP

(57) ABSTRACT

A pin fin heat sink includes a plurality of pin fins extending from a base plate, at least one of the plurality of pin fins defining a hollow portion therein. The pin fin heat sink also includes an annular ring of metal foam material disposed within the hollow portion, the annular ring of metal foam material having a radially outer surface in direct contact with an inner diameter of the pin fin, the annular ring of metal foam material defining a central cavity. The pin fin heat sink further includes a phase change material disposed within the central cavity.

14 Claims, 2 Drawing Sheets

(56) References Cited

U.S. PATENT DOCUMENTS

| | | |
|---|---|---|
| 2013/0292091 A1 | 11/2013 | Ishikawa |
| 2014/0090808 A1* | 4/2014 | Bessho ................ H01L 23/427 |
| | | 165/104.17 |
| 2015/0359137 A1 | 12/2015 | Campbell et al. |
| 2017/0219294 A1* | 8/2017 | Longis ................ F28F 21/084 |
| 2018/0092252 A1 | 3/2018 | Bouras |

OTHER PUBLICATIONS

European Search Report for Application No. 20162115.8, dated Aug. 14, 2020, 84 pages.

* cited by examiner

PIN FIN HEAT SINK WITH INTEGRATED PHASE CHANGE MATERIAL AND METHOD

CROSS-REFERENCE TO RELATED APPLICATION

This application is a continuation-in-part of U.S. patent application Ser. No. 15/280,074, filed Sep. 29, 2016, the disclosure of which is incorporated herein in its entirety.

BACKGROUND

Exemplary embodiments pertain to the art of heat sink and, more particularly, to a pin fin heat sink, as well as a method of manufacturing a pin fin heat sink.

Heat sinks capable of drawing heat from one place and dissipating it in another place are known and are used in numerous applications where efficiently removing heat is desirable. One type of heat sink used in fluid cooling systems dissipates heat from two parallel fluid passages into a cooling fluid passage between the passages. A cooling fluid (such as air) is then passed through the cooling fluid passage. Heat from the parallel fluid passages is drawn into the cooling fluid passage and is expelled at the opposite end of the heat sink with the cooling fluid.

Electronic devices such as those used for power electronics in aircraft applications or directed energy weapons often experience periodic load transients that produce peak thermal loads. During times of peak thermal loads, the thermal capacity of the cooling fluid may be exceeded leading to a steep rise in the electronic device temperature. Alternatively, a temporary reduction in the cooling capacity of the heat sink can also lead to a significant rise in the electronic device temperature.

BRIEF DESCRIPTION

Disclosed is a pin fin heat sink including a plurality of pin fins extending from a base plate, at least one of the plurality of pin fins defining a hollow portion therein. The pin fin heat sink also includes an annular ring of metal foam material disposed within the hollow portion, the annular ring of metal foam material having a radially outer surface in direct contact with an inner diameter of the pin fin, the annular ring of metal foam material defining a central cavity. The pin fin heat sink further includes a phase change material disposed within the central cavity.

Also disclosed is a pin fin heat sink including a plurality of pin fins extending from a base plate, at least one of the plurality of pin fins defining a hollow portion therein. The pin fin heat sink also includes an annular ring of metal foam material disposed within the hollow portion, the annular ring of metal foam material impregnated with a phase change material and defining a central cavity, the central cavity at least partially filled with phase change material.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Figure 2:
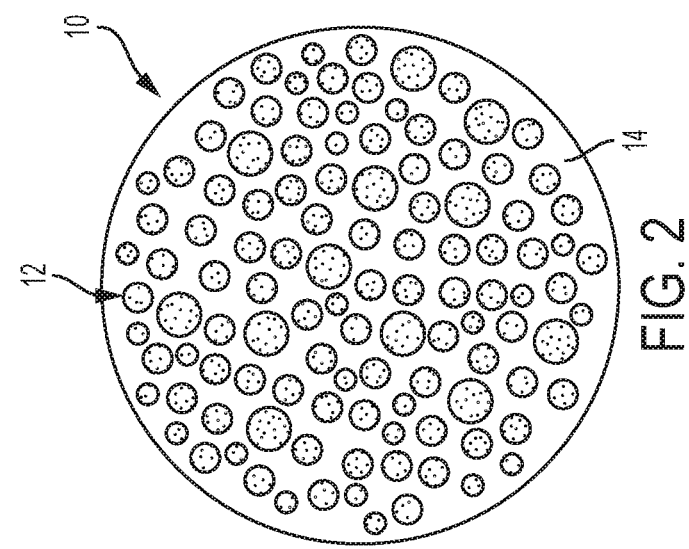
FIG. 2 is a top plan view of the pin fin heat sink.
Figure 1:
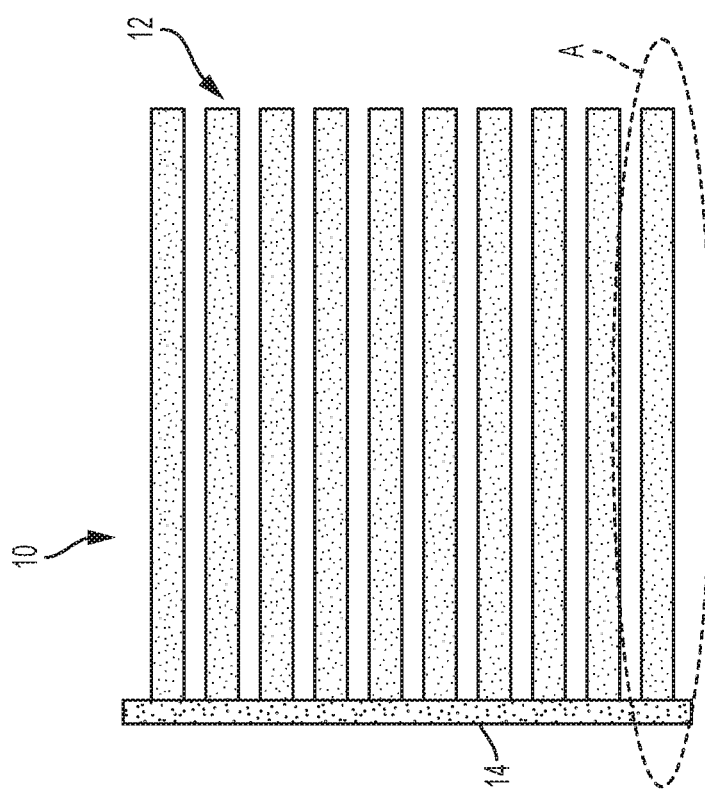
FIG. 1 is an elevational view of a pin fin heat sink.

Referring to FIGS. 1 and 2, a portion of a pin fin heat sink is illustrated and generally referenced with numeral 10. In order to increase the surface area exposed to a cooling fluid in a cooling fluid passage, and thereby increase the heat transfer potential of the heat sink, a plurality of thermally conductive pins 12 are provided. The pins 12 conduct heat away from a zone to be cooled and into the cooling fluid passage, thereby exposing more surface area to the cooling fluid flowing through the cooling fluid passage. Since the amount of heat dissipated in the heat sink 10 is proportional to the surface area exposed to the cooling fluid, and the pins 12 generate more exposed surface area, the efficiency of the heat sink 10 is increased.

As shown, a plurality of pins 12 are operatively connected to, and extend from, a base plate 14. The pins 12 may be arranged in various contemplated manners. For example, each of the pins 12 may be formed of an equal diameter and extend an equal length away from the base plate 14. Alternatively, the diameters of at least one of the pins 12 may be distinct from at least one of the other pins 12. In some embodiments, all of the pins 12 have distinct diameters. Similarly, the length of at least one of the pins 12 may be distinct from at least one of the other pins 12. In some embodiments, all of the pins 12 have distinct lengths. A combination of distinct diameters and lengths is provided in some embodiments. By varying the diameters and/or lengths of the pins 12, a turbulent flow is induced, thereby enhancing heat transfer.

Figure 3:
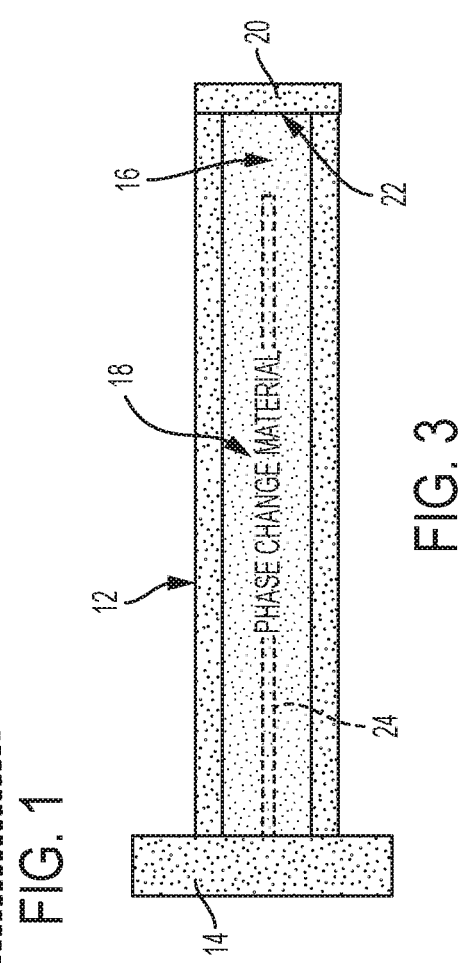
FIG. 3 is an enlarged view of Section A of FIG. 1, illustrating one pin fin of the pin fin heat sink.

Referring to FIG. 3, an enlarged illustration of one of the pins 12 is provided. In contrast to solid fins of any shape, and particularly in contrast to solid cylindrical pins of other heat sinks, the pins 12 disclosed herein define a hollow portion 16 therein. In the illustrated embodiment, the hollow portion 16 extends substantially along nearly an entire length of the pin 12, but it is to be appreciated that the hollow portion 16 may extend only partially along the length of the pin 12 in some embodiments.

The pin 12 may be formed and connected to the base plate 14 in various contemplated manners. For example, the pin 12 may be an extruded hollow tube that is brazed to the base plate 14. Alternatively, an additive manufacturing process may be employed to build up the hollow tube from the base plate 14, with the hollow portion 16 defined therein. In either embodiment, a phase change material 18 is introduced into the hollow portion 16 of the pin 12. The pin 12 then has a cap 20 positioned on an open end 22 of the pin 12 and it is brazed thereto, thereby sealing the phase change material within the hollow portion 16. It is contemplated that alternative manufacturing processes are employed, such as connecting a pin that is pre-filled with the phase change material 18 to the base plate 14 or filling a pin with the phase change material 18 that is integrally formed with the base plate 14.

The phase change material 18 comprises paraffin wax in some embodiments, but it is to be understood that any suitable phase change material is contemplated and may vary depending on the particular conditions of different applications. Integrating the phase change material 18 into the pins 12 enables the heat sink 10 to absorb transient thermal loads without a spike in the device temperature. During a transient event, the phase change material 18 absorbs the thermal energy and changes phase at a constant temperature. After the transient event, the latent heat is rejected as the phase change material 18 reverts back to its original state. This improves over conventional solid heat sinks which lack latent heat storage and would experience sensible heating during the peak thermal load.

A metal foam material 24 is provided in the hollow portion 16 in some embodiments to increase the thermal conductivity of the phase change material 18 disposed in the hollow portion 16 of the pin 12. In some embodiments, the metal foam material 24 is positioned along a central portion of the hollow portion 16, as shown in the illustrated embodiment. In other embodiments, the metal foam material 24 extends radially to the inner walls of the pin 12 that defines the hollow portion 16. The metal foam material 24 is impregnated with the phase change material during manufacture.

Figure 4:
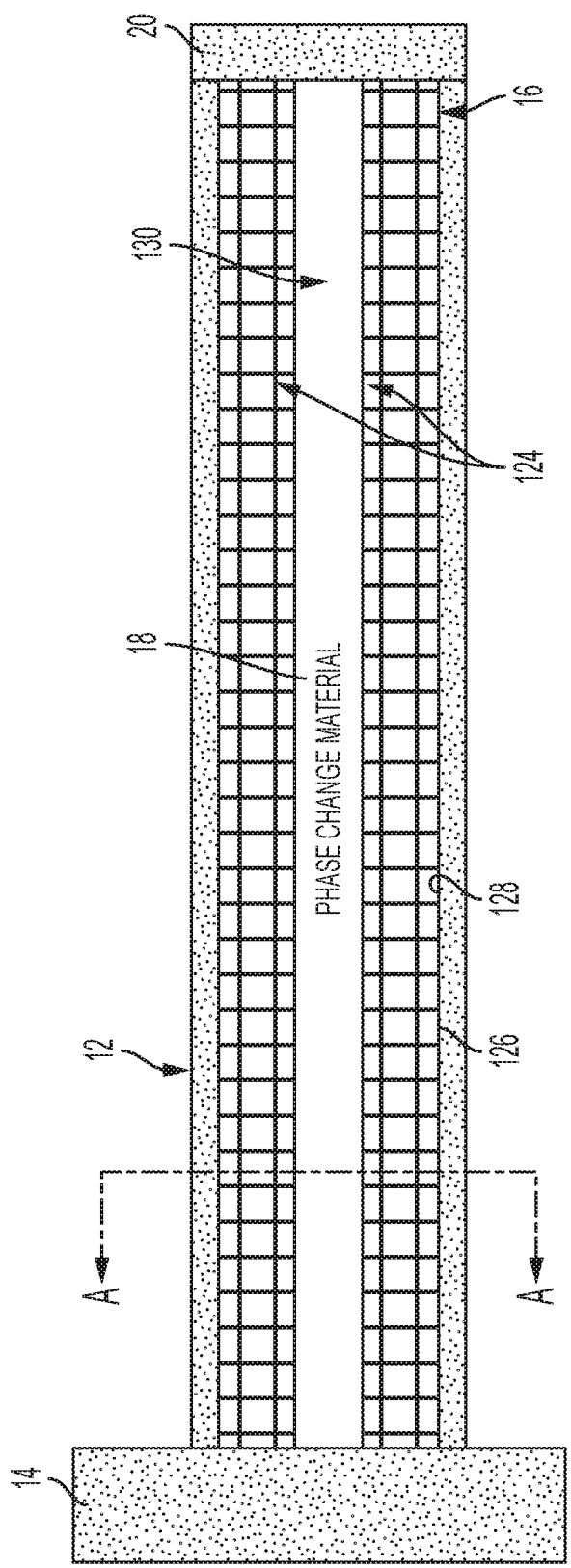
FIG. 4 is an enlarged view of Section A of FIG. 1, illustrating one pin fin of the pin fin heat sink according to another aspect of the disclosure.
Figure 5:
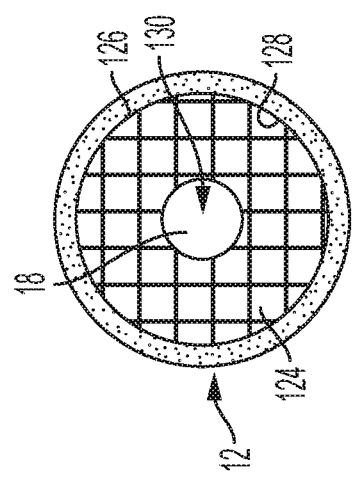
FIG. 5 is a cross-sectional view taken along line A-A of FIG. 4.

Referring now to FIGS. 4 and 5, an enlarged illustration of one of the pins 12 is shown according to another embodiment. In the illustrated embodiment, an annular ring of metal foam material 124 is provided in the hollow portion 16 in some embodiments to increase the thermal conductivity of the phase change material 18 disposed in the hollow portion 16 of the pin 12. The annular ring of metal foam material 124 includes a radially outer surface 126 in contact with an inner diameter 128 of the pin 12. Direct contact between the annular ring 124 and the pin 12 conducts heat to the outer wall of the pin 12. As with the embodiments described above, the annular ring of metal foam material 124 is impregnated with the phase change material during manufacture. The annular ring of metal foam material 124 defines a central cavity 130 that purely contains phase change material 18 therein for further latent heat storage. In some embodiments, the central cavity is positioned to extend substantially along a central axis of the pin 12 and/or the hollow portion 16.

The size of the annular ring can be optimized based upon the specific application to balance latent heat capacity (utilizing phase change material) with thermal conduction from the heat source (utilizing metal foam and the solid pin wall).

Although a single pin is described in detail above, it is to be appreciated that more than one of the pins 12 includes the hollow portion 16 and phase change material 18 in some embodiments. Furthermore, all of the plurality of pins 12 includes the hollow portion 16 and phase change material 18 in some embodiments.

Advantageously, the embodiments disclosed herein enable the heat sink 10 to better handle transient thermal loads that the heat sink 10 is subjected to during operation.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A pin fin heat sink comprising:
a plurality of pin fins extending from a base plate, at least one of the plurality of pin fins defining a hollow portion therein;
an annular ring of metal foam material disposed within the hollow portion, the annular ring of metal foam material having a radially outer surface in direct contact with an inner diameter of the pin fin, the annular ring of metal foam material defining a central cavity; and
a phase change material disposed within the central cavity, wherein the phase change material comprises paraffin wax.

2. The pin fin heat sink of claim 1, wherein at least one of the pin fins is formed of a diameter that is different than at least one of the remaining pin fins.

3. The pin fin heat sink of claim 1, wherein all of the pin fins have different diameters relative to each other.

4. The pin fin heat sink of claim 1, wherein the pin fins are brazed to the base plate.

5. The pin fin heat sink of claim 1, wherein the pin fins are additively manufactured to be connected, and extend from, the base plate.

6. The pin fin heat sink of claim 1, wherein the central cavity is positioned to extend along a central axis of the pin.

7. The pin fin heat sink of claim 1, wherein the central cavity is positioned to extend along a central axis of the hollow portion.

8. A pin fin heat sink comprising:
a plurality of pin fins extending from a base plate, at least one of the plurality of pin fins defining a hollow portion therein; and
an annular ring of metal foam material disposed within the hollow portion, the annular ring of metal foam material impregnated with a phase change material and defining a central cavity, the central cavity at least partially filled with phase change material, wherein the phase change material comprises paraffin wax.

9. The pin fin heat sink of claim 8, wherein at least one of the pin fins is formed of a diameter that is different than at least one of the remaining pin fins.

10. The pin fin heat sink of claim 8, wherein all of the pin fins have different diameters relative to each other.

11. The pin fin heat sink of claim 8, wherein the pin fins are brazed to the base plate.

12. The pin fin heat sink of claim 8, wherein the pin fins are additively manufactured to be connected, and extend from, the base plate.

13. The pin fin heat sink of claim 8, wherein the central cavity is positioned to extend along a central axis of the pin.

14. The pin fin heat sink of claim 8, wherein the central cavity is positioned to extend along a central axis of the hollow portion.

* * * * *